(12) United States Patent
Wu

(10) Patent No.: US 7,643,854 B2
(45) Date of Patent: Jan. 5, 2010

(54) BUCKLING MECHANISM

(75) Inventor: Kuo-Tai Wu, Taipei (TW)

(73) Assignee: Accton Technology Corporation, Hsinchu (TW)

( * ) Notice: Subject to any disclaimer, the term of this patent is extended or adjusted under 35 U.S.C. 154(b) by 1043 days.

(21) Appl. No.: 11/143,668

(22) Filed: Jun. 3, 2005

(65) Prior Publication Data

US 2005/0276011 A1 Dec. 15, 2005

(30) Foreign Application Priority Data

Jun. 15, 2004 (TW) .............................. 93117223 A

(51) Int. Cl.
*H04M 1/00* (2006.01)
(52) U.S. Cl. .............................. 455/575.1; 379/433.01; 361/752
(58) Field of Classification Search ................ 455/90.3, 455/347, 575.1; 379/430, 433.01; 361/752, 361/759, 814
See application file for complete search history.

(56) References Cited

U.S. PATENT DOCUMENTS

| 6,428,350 | B1 * | 8/2002 | Robinson et al. ............. 439/517 |
| 6,754,080 | B2 * | 6/2004 | Lee et al. ..................... 361/710 |
| 6,856,814 | B2 * | 2/2005 | Kung et al. .................. 455/557 |
| 6,892,082 | B2 * | 5/2005 | Boesen ..................... 455/575.3 |
| 6,895,643 | B2 * | 5/2005 | Itoigawa et al. ............... 24/633 |

* cited by examiner

*Primary Examiner*—Nhan T Le
(74) *Attorney, Agent, or Firm*—Bacon & Thomas, PLLC

(57) ABSTRACT

A buckling mechanism used to fasten an electronic device such as a wireless broadband access point device or a wireless broadband router onto a bracket. The electronic device includes a top plate and a side plate having a side-plate aperture. The bracket is disposed on the top plate and has a bracket aperture. The buckling mechanism includes a first body portion, an embedding portion, a second body portion and a buckle portion. The embedding portion is disposed on one side of the first body portion to be embedded into the side-plate aperture. The second body portion is perpendicular and connected to another side of the first body portion, while the buckle portion is disposed on another side of the second body portion to be buckled with the bracket aperture.

21 Claims, 5 Drawing Sheets

BUCKLING MECHANISM

This application claims the benefit of Taiwan application Serial No. 93117223, filed Jun. 15, 2004, the subject matter of which is incorporated herein by reference.

BACKGROUND OF THE INVENTION

1. Field of the Invention

The invention relates in general to a buckling mechanism, and more particularly to a buckling mechanism used to firmly buckle an electronic device such as a wireless broadband access point device or a wireless broadband router with a bracket embedded in the ceiling or the wall.

2. Description of the Related Art

With the rapid advance in science and technology, computer and Internet have become indispensable everydayness to modern people. Moreover, in order to satisfy the increasing needs of speed transmission and high volume data flow in network transmission, broadband network is gaining greater and greater popularity in ordinary offices and households. Conventionally, the user couples a computer to a broadband access point device or a broadband router via a network line. When the number of computers connected to the broadband access point device or the broadband router is increased, the required network lines would be increased, twisted in a mess, and occupying a large space. In order to resolve the problems that would arise if the network lines are dispensed, a wireless broadband access point device or a wireless broadband router is provided according to the technology of wireless signal transmission. When using the wireless broadband access point device, the user has to perform identification on the computer and the wireless broadband access point device to establish the connection in wireless signal communication. Once the connection is established, the user can get access to the Internet or network via the computer and the wireless broadband access point device. Generally speaking, the wireless broadband access point device can be mounted on or dismounted from a wall or a ceiling to provide wireless network connection to a number of computers from a high position. Apart from saving space, the transmission of wireless signals is also improved.

Besides, the wireless broadband access point device is fastened on the wall or the ceiling via a bracket. The bracket and the wireless broadband access point device or the wireless broadband router is buckled together via a hook and an aperture. Moreover, a spring piece is used to divide the bracket and the wireless broadband access point device apart, so that the hook and the aperture are buckled but not firmly connected together. If the wireless broadband access point device is hit by an unexpected external force, the wireless broadband access point device would compress the spring piece to move towards the bracket so that the hook and the aperture are disconnected and slide away from each other. For example, when the wireless broadband access point device is hit by the user during assembly or jolted during an earthquake, the wireless broadband access point device would be detached from the bracket and fall to the ground. Even worse than that, the wireless broadband access point device may hurt the user or a third party when falling down to the ground.

SUMMARY OF THE INVENTION

It is therefore the object of the invention to provide a buckling mechanism preventing the electronic device from being detached from the bracket due to an unexpected external force, lest the electronic device might fall onto the ground and damage or cause injury to the user or a third party.

According to an object of the invention, a buckling mechanism used to fix an electronic device on a bracket is provided. The electronic device includes a top plate and a side plate. The side plate has a side-plate aperture. The bracket is disposed on the top plate and has a bracket aperture. The buckling mechanism includes a first body portion, an embedding portion, a second body portion and a buckle portion. The embedding portion is disposed on one side of the first body portion to be embedded into the side-plate aperture. The second body portion is perpendicular and connected to another side of the first body portion. The buckle portion is disposed on another side of the second body portion to be buckled with the bracket aperture.

According to another object of the invention, an electronic device including a side plate, a top plate, a bracket and a buckling mechanism is provided. The side plate has a side-plate aperture. The top plate is perpendicular and connected to side plate, and has a top-plate aperture. The bracket is disposed on the top plate and has a bracket aperture. The buckling mechanism includes a first body portion, an embedding portion, a second body portion and a buckle portion. The embedding portion is disposed on one side of the first body portion to be embedded into the side-plate aperture disposed on the side plate of the electronic device. The second body portion is perpendicular and connected to another side of the first body portion. The buckle portion is disposed on another side of the second body portion to be buckled with the bracket aperture.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1A:
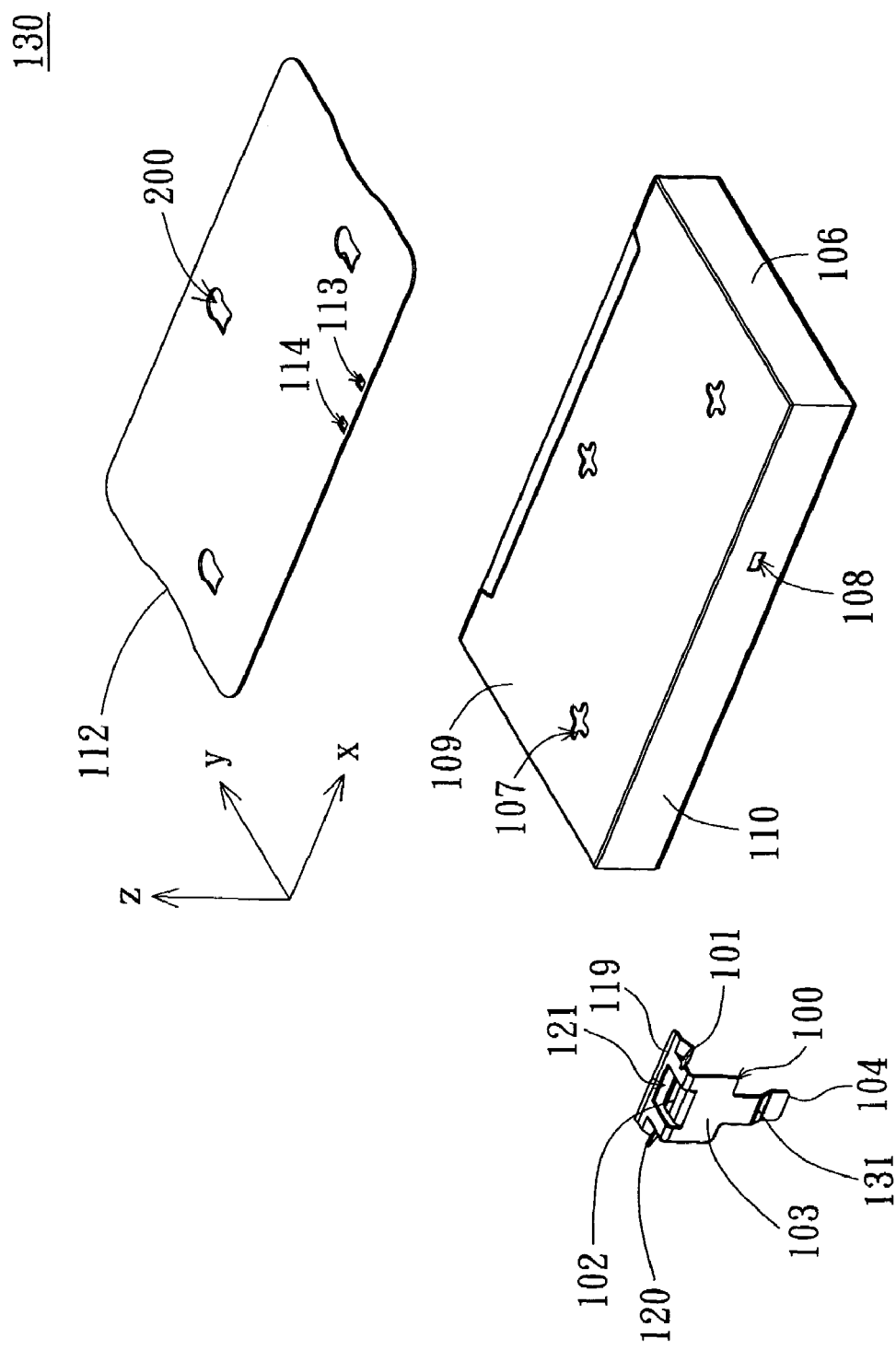
FIG. 1A is an exploded diagram of an electronic device, a bracket, and a buckling mechanism according to a preferred embodiment of the invention.
Figure 1B:
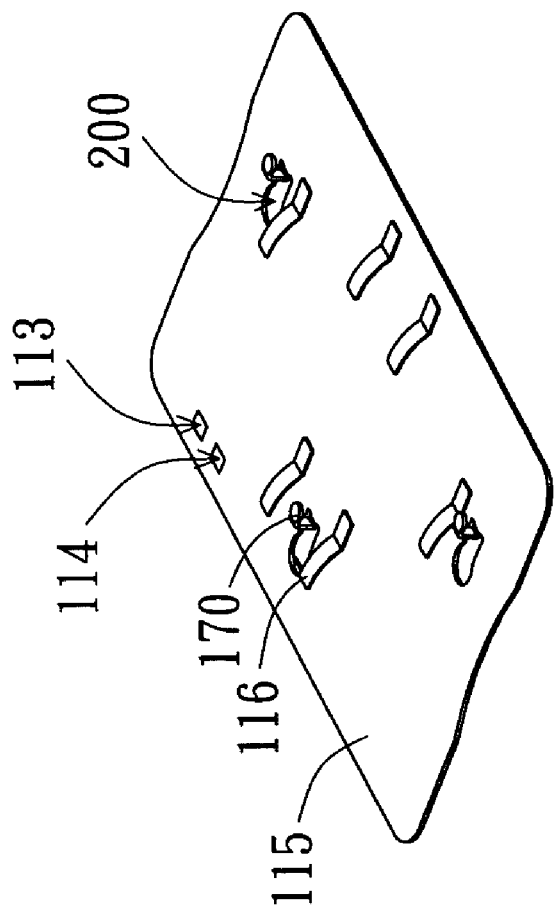
FIG. 1B is an inverted diagram of the bracket of FIG. 1A.
Figure 2:
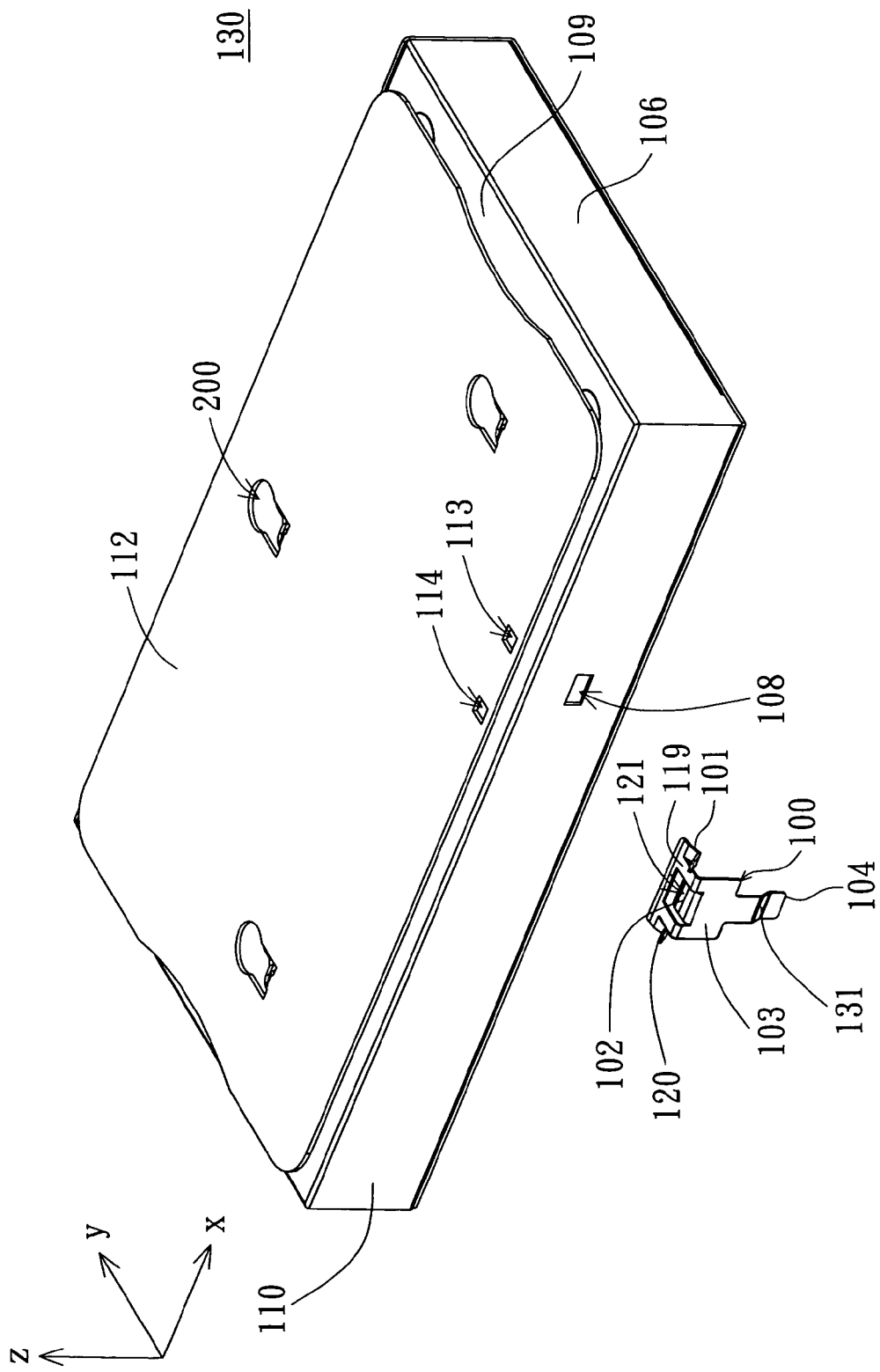
FIG. 2 is an enlarged 3-D diagram when the electronic device and bracket of FIG. 1A are connected together.

Referring to FIG. 1A, an exploded diagram of an electronic device, a bracket and a buckling mechanism according to a preferred embodiment of the invention is shown. In FIG. 1A, a mounting-type electronic device 130 includes an electronic device 106, a bracket 112 and a buckling mechanism 100. The user can dispose the mounting-type electronic device 130 on the wall or the ceiling. The electronic device 106 at least includes a top plate 109 and a side plate 110. A circuit board, a connection line and an electronic part are disposed inside the electronic device 106. The side plate 110 has a side-plate aperture 108 disposed thereon, while the top plate 109 has several cross-shaped top-plate apertures 107 disposed thereon. Besides, the electronic device 106 can be a wireless broadband access point device or a wireless broadband router for example. The bracket 112 at least has a mounting hole and a bracket aperture, such as three mushroom-shaped mounting holes 200, a square first bracket aperture 113 and a square second bracket aperture 114. The mounting hole 200 is for receiving a fixing piece (not shown in FIG. 1A) disposed on the wall or the ceiling, so that the bracket 112 is fastened on the wall or the ceiling. As shown in FIG. 1B, the bracket surface 115 of the bracket 112 at least has a hook and a spring piece disposed thereon such as three hooks 170 and six spring pieces 116. The three hooks 170 are used to be correspondingly buckled with the three top-plate apertures 107 of the electronic device 106. As shown in FIG. 2, when the bracket 112 is connected with the electronic device 106, the three hooks 170 are correspondingly inserted into the three top-plate apertures 107 and the six spring pieces 116 of the bracket 112 contact the top plate 109. Meanwhile, the compressed spring pieces 116 provide a spring force to divide the bracket 112 and the electronic device 106 apart so that the hook 170 is firmly connected with the top-plate aperture 107.

Refer to both FIG. 1A and FIG. 2. A buckling mechanism 100 includes a first body portion 103, a second body portion 119, an embedding portion 104, a first buckle portion 101 and a second buckle portion 120. One side of the second body portion 119 is perpendicular and connected to one side of the first body portion 103, so that the buckling mechanism 100 is approximately an L-shaped structure. The embedding portion 104 is disposed on one side of the first body portion 103 and embedded into the side-plate aperture 108 to be deeply indented into the electronic device 106. Besides, the buckling mechanism 100 further includes a deflection portion 131. The deflection portion 131 is used to connect the embedding portion 104 with the first body portion 103, so that the embedding portion 104 is not co-planar with the first body portion 103 for the embedding portion 104 to be deeply indented into the electronic device 106 via the side-plate aperture 108. The first buckle portion 101 and the second buckle portion 120 are symmetrically disposed on another side of the second body portion 119 to be correspondingly buckled with the first bracket aperture 113 and the second bracket aperture 114, respectively. Besides, the first buckle portion 101 and the second buckle portion 120 form a V-shaped structure for the deflections of the first buckle portion 101 and the second buckle portion 120 to be correspondingly indented into the first bracket aperture 113 and the second bracket aperture 114.

According to the present embodiment, the buckling mechanism 100 further includes a tongue portion 102. The first body portion 103 has a body portion aperture 121. The tongue portion 102 is parallel to the second body portion 119 and extends outwardly from one wall of the body portion aperture 121 to be inserted into the clearance between the bracket 112 and the electronic device 106, or retains the bracket 112 with the second body portion 119 from above and from underneath the bracket 112, respectively. Besides, the first body portion 103, the second body portion 119, the embedding portion 104, the first buckle portion 101, the second buckle portion 120 and the tongue portion 102 are integrally formed such as a metal spring piece for instance.

Figure 3:
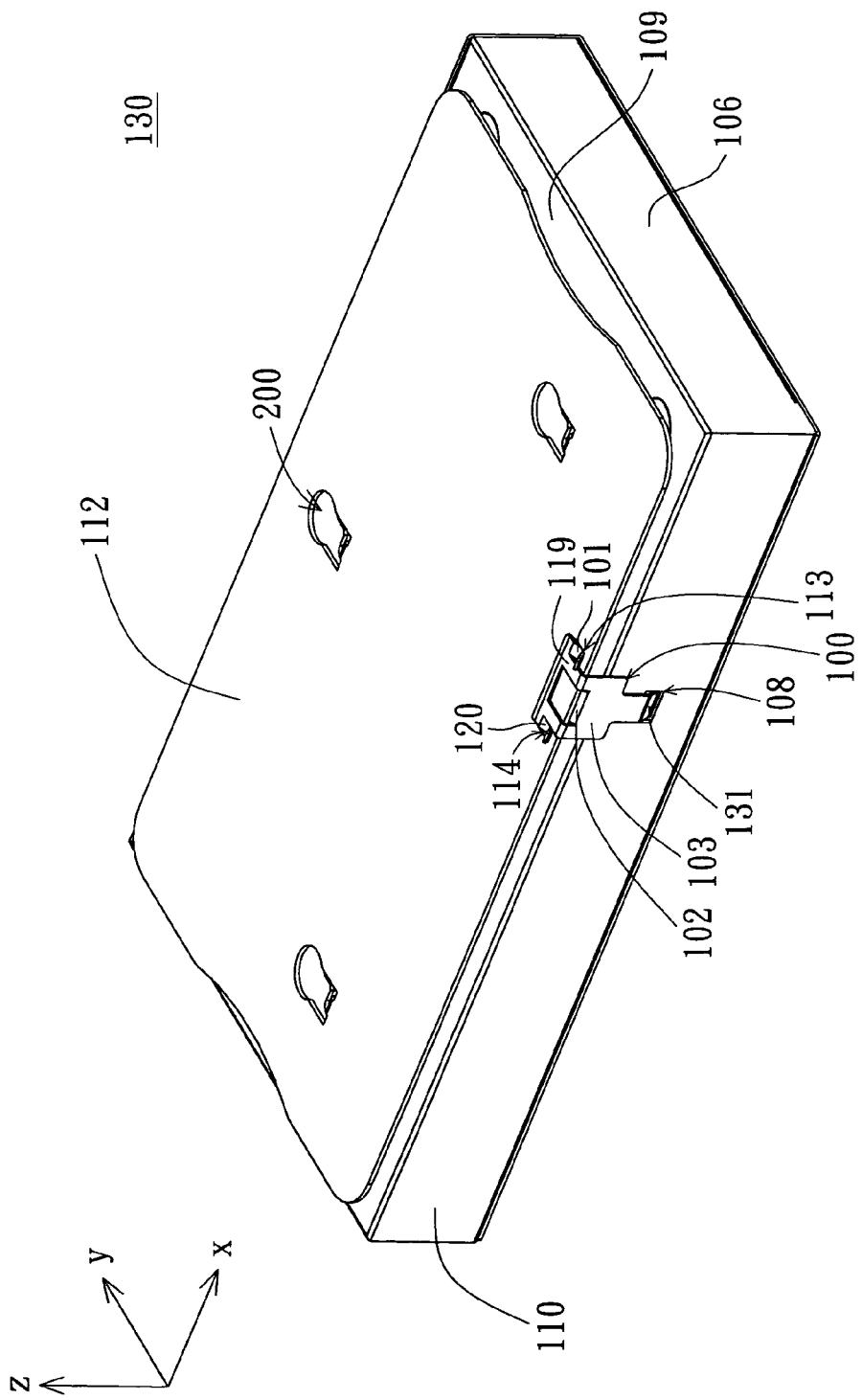
FIG. 3 is an enlarged 3-D diagram when the electronic device, bracket and buckling mechanism of FIG. 1A are connected together.
Figure 4:
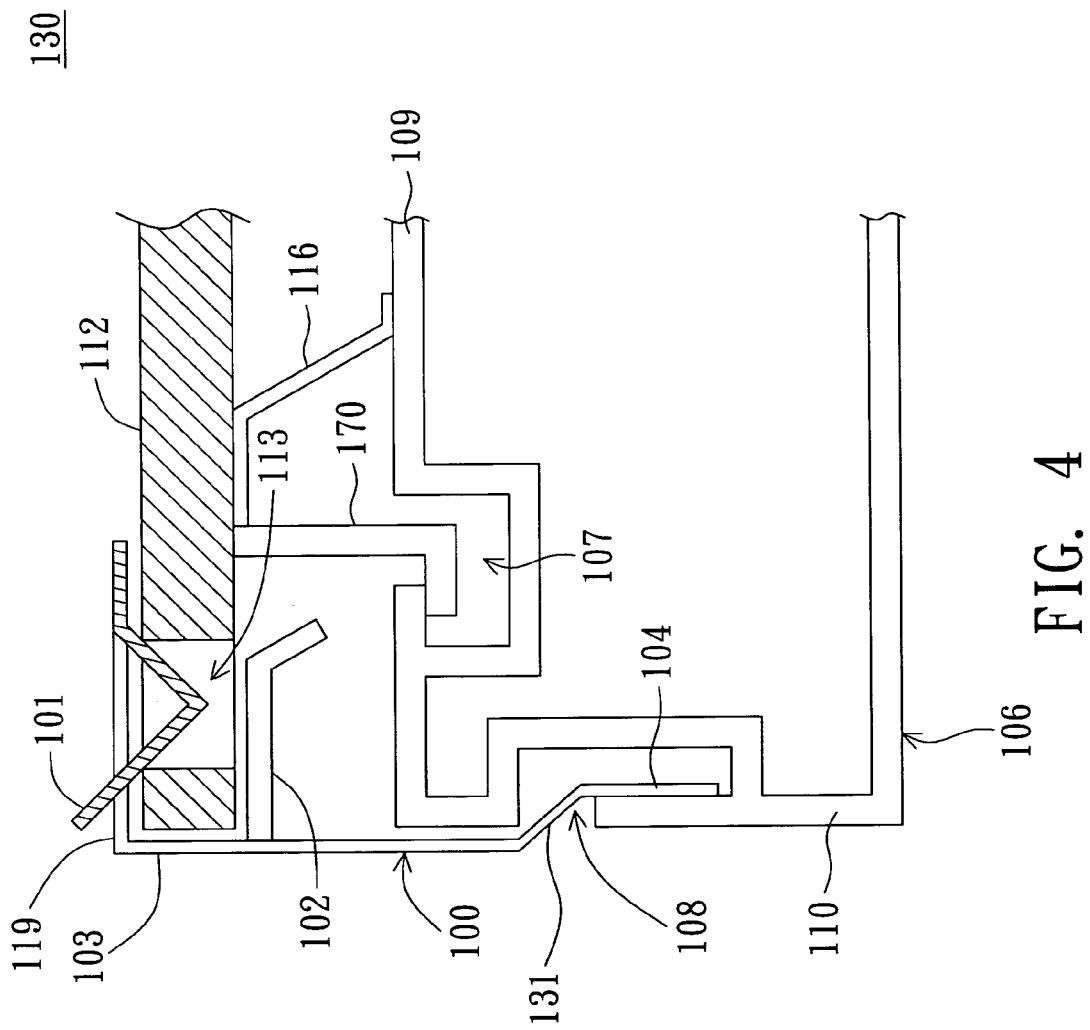
FIG. 4 is a partial cross-sectional diagram of electronic device, bracket and buckling mechanism using the yz plane of FIG. 3 as the cross-section and viewed along x direction.

As shown in FIGS. 3~4, when the electronic device 106 is buckled with the bracket 112, the embedding portion 104 is embedded into the side-plate aperture 108, the tongue portion 102 and the second body portion 119 respectively retain the bracket 112 from above and from underneath the bracket 112. The first buckle portion 101 and the second buckle portion 120 are correspondingly buckled with the first bracket aperture 113 and the second bracket aperture 114. By doing so, the buckling mechanism 100 firmly buckles the electronic device 106 with the bracket 112 in the x, y and z directions with enforced protection to prevent the electronic device 106 from being detached from the bracket 112 when the electronic device 106 receives an external force.

Anyone who understands the technology will realize that the technology of the present embodiment is not limited thereto. For example, the mounting-type electronic device 130 can be a wireless broadband access point device or a wireless broadband router. That is to say, the electronic device 106 is the body of the wireless broadband access point device or the wireless broadband router, the bracket 112 enables the wireless broadband access point device or the wireless broadband router to be hung on the wall or the ceiling, and the buckling mechanism 110 fastens the electronic device 106 on the bracket 112 firmly when the wireless broadband access point device or the wireless broadband router is hung on the wall or the ceiling.

The buckling mechanism disclosed in above embodiment of the invention has a shock-proof design of buckling the electronic device with the bracket to be firmly connected, lest the electronic device might be damaged due to unexpected external forces. For example, when the wireless broadband access point device or the wireless broadband router is hit by the user during assembly or jolted during earthquake, the wireless broadband access point device or the wireless broadband router would be detached from the bracket and fall to the ground. Even worse than that, the falling wireless broadband access point device or the wireless broadband router may hurt the user or a third party. By doing so, the above accidents can be prevented, and the occurrences of the user or the third party being injured by the falling electronic device can be reduced.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A buckling mechanism for buckling an electronic device with a bracket, wherein the electronic device comprises a top plate and a side plate having a side-plate aperture, and the top plate has a top-plate aperture, the bracket is disposed on the top plate and comprises a first bracket aperture, a hook and a spring piece, and the spring piece is for contacting the top plate and providing a spring force to divide the top plate and the bracket apart when the hook is inserted into the top-plate aperture for the hook to be firmly buckled with the top-plate aperture, the buckling mechanism comprises:

a first body portion;

an embedding portion disposed on one side of the first body portion to be embedded into the side-plate aperture;

a second body portion with one side being perpendicular and connected to another side of the first body portion; and a first buckle portion disposed on another side of the second body portion to be buckled with the first bracket aperture.

2. The buckling mechanism according to claim 1, further comprising:

a tongue portion parallel to the second body portion and extending outwardly from the first body portion to be inserted into the clearance between the bracket and the top plate or retain the bracket with the second body portion.

3. The buckling mechanism according to claim 2, wherein the first body portion further has a body portion aperture whose one wall extends outside the tongue portion.

4. The buckling mechanism according to claim 2, wherein the bracket further comprises a second bracket aperture, the buckling mechanism further comprises:
a second buckle portion symmetric to the first buckle portion and disposed on the another side of the second body portion to be buckled with the second bracket aperture.

5. The buckling mechanism according to claim 4, wherein the first body portion, the embedding portion, the second body portion, the first buckle portion, the second buckle portion and the tongue portion are integrally formed.

6. The buckling mechanism according to claim 1, wherein the buckling mechanism is approximately an L-shaped structure.

7. The buckling mechanism according to claim 1, wherein the first buckle portion is a V-shaped structure.

8. The buckling mechanism according to claim 1, wherein the electronic device is a wireless broadband access point device or a wireless broadband router.

9. The buckling mechanism according to claim 1, wherein the buckling mechanism is a metal spring piece.

10. An electronic device, comprising:
a side plate having a side-plate aperture;
a top plate perpendicular and connected to the side plate and having a top-plate aperture;
a bracket disposed on the top plate and having a first bracket aperture, a hook and a spring piece, wherein the spring piece is for contacting the top plate and providing a spring force to divide the top plate and the bracket apart when the hook is inserted into the top-plate aperture for the hook to be firmly buckled with the top-plate aperture; and
a buckling mechanism, comprising:
a first body portion;
an embedding portion disposed on one side of the first body portion to be embedded into the side-plate aperture;
a second body portion whose one side is perpendicular and connected to another side of the first body portion; and
a first buckle portion disposed on another side of the second body portion to be buckled with the first bracket aperture.

11. The electronic device according to claim 10, wherein the buckling mechanism further comprises:
a tongue portion parallel to the second body portion and extending from the first body portion to be inserted into the clearance between the bracket and the top plate or retain the bracket with the second body portion.

12. The electronic device according to claim 11, wherein the first body portion further has a body portion aperture whose one wall extends outside the tongue portion.

13. The electronic device according to claim 11, wherein the bracket further comprises a second bracket aperture, the buckling mechanism further comprises:
a second buckle portion symmetric to the first buckle portion and disposed on the another side of the second body portion to be buckled with the second bracket aperture.

14. The electronic device according to claim 13, wherein the first body portion, the embedding portion, the second body portion, the first buckle portion, the second buckle portion and the tongue portion are formed in one piece.

15. The electronic device according to claim 10, wherein the buckling mechanism is approximately an L-shaped structure.

16. The electronic device according to claim 10, wherein the first buckle portion is a V-shaped structure.

17. The electronic device according to claim 10, wherein the electronic device is a wireless broadband access point device or a wireless broadband router.

18. The electronic device according to claim 10, wherein the buckling mechanism is a metal spring piece.

19. An L-shaped buckling mechanism for buckling a wireless broadband access point device with a bracket, wherein the wireless broadband access point device comprises a top plate and a side plate having a side-plate aperture, the bracket is disposed on the top plate, the bracket comprises a first bracket aperture and a second bracket aperture, the buckling mechanism comprises:
a first body portion;
an embedding portion disposed on one side of the first body portion to be embedded into the side-plate aperture;
a second body portion whose one side is perpendicular and connected to another side of the first body portion;
a first V-shaped buckle portion disposed on another side of the second body portion to be buckled with the first bracket aperture;
a second V-shaped buckle portion symmetric to the first V-shaped buckle portion and disposed on the another side of the second body portion to be buckled with the second bracket aperture; and
a tongue portion parallel to the second body portion and extends outwardly from the first body portion to be inserted into the clearance between the bracket and the top plate or retain the bracket with the second body portion;
wherein the first body portion, the embedding portion, the second body portion, the first V-shaped buckle portion, the second V-shaped buckle portion and the tongue portion are formed in one piece.

20. The buckling mechanism according to claim 19, wherein the top plate has a top-plate aperture, the bracket further comprises a hook and a spring piece, the spring piece is for contacting the top plate and providing a spring force to divide the top plate and the bracket apart when the hook is inserted into the top-plate aperture for the hook to be firmly buckled with the top-plate aperture.

21. The buckling mechanism according to claim 19, wherein buckling mechanism is a metal spring piece.

* * * * *

UNITED STATES PATENT AND TRADEMARK OFFICE
CERTIFICATE OF CORRECTION

PATENT NO. : 7,643,854 B2  Page 1 of 1
APPLICATION NO. : 11/143668
DATED : January 5, 2010
INVENTOR(S) : Kuo-Tai Wu It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1251 days.

Signed and Sealed this

Twenty-first Day of December, 2010

David J. Kappos
*Director of the United States Patent and Trademark Office*